United States Patent
Kasai et al.

(10) Patent No.: US 7,858,502 B2
(45) Date of Patent: Dec. 28, 2010

(54) FABRICATION METHOD AND FABRICATION APPARATUS OF GROUP III NITRIDE CRYSTAL SUBSTANCE

(75) Inventors: Hitoshi Kasai, Itami (JP); Takuji Okahisa, Itami (JP); Shunsuke Fujita, Itami (JP); Naoki Matsumoto, Itami (JP); Hideyuki Ijiri, Itami (JP); Fumitaka Sato, Itami (JP); Kensaku Motoki, Itami (JP); Seiji Nakahata, Itami (JP); Koji Uematsu, Itami (JP); Ryu Hirota, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/540,492

(22) Filed: Aug. 13, 2009

(65) Prior Publication Data
US 2010/0009526 A1 Jan. 14, 2010

Related U.S. Application Data

(63) Continuation of application No. 11/643,675, filed on Dec. 22, 2006, now Pat. No. 7,589,000.

(30) Foreign Application Priority Data

Dec. 28, 2005 (JP) .............................. 2005-379917
Aug. 10, 2006 (JP) .............................. 2006-218475

(51) Int. Cl.
*H01L 21/00* (2006.01)
(52) U.S. Cl. .................. 438/478; 438/483; 438/503
(58) Field of Classification Search .............. 438/478, 438/483, 503
See application file for complete search history.

(56) References Cited

U.S. PATENT DOCUMENTS 4,144,116 A 3/1979 Jacob et al.

(Continued)

FOREIGN PATENT DOCUMENTS

EP 1 246 233 A2 10/2002

(Continued)

OTHER PUBLICATIONS

European Search Report issued in corresponding European Patent Application No. 06025043.8-2122, dated Mar. 20, 2007.

(Continued)

*Primary Examiner*—Laura M Menz
(74) *Attorney, Agent, or Firm*—McDermott Will & Emery LLP

(57) ABSTRACT

A fabrication method of a group III nitride crystal substance includes the steps of cleaning the interior of a reaction chamber by introducing HCl gas into the reaction chamber, and vapor deposition of a group III nitride crystal substance in the cleaned reaction chamber. A fabrication apparatus of a group III nitride crystal substance includes a configuration to introduce HCl gas into the reaction chamber, and a configuration to grow a group III nitride crystal substance by HVPE. Thus, a fabrication method of a group III nitride crystal substance including the method of effectively cleaning deposits adhering inside the reaction chamber during crystal growth, and a fabrication apparatus employed in the fabrication method are provided.

6 Claims, 3 Drawing Sheets

U.S. PATENT DOCUMENTS

| | | | |
|---|---|---|---|
| 5,915,194 A | 6/1999 | Powell et al. | |
| 6,086,673 A | 7/2000 | Molnar | |
| 6,177,292 B1 | 1/2001 | Hong et al. | |
| 6,488,771 B1 | 12/2002 | Powell et al. | |
| 6,596,079 B1* | 7/2003 | Vaudo et al. | 117/97 |
| 6,627,552 B1 | 9/2003 | Nishio et al. | |
| 6,899,767 B2 | 5/2005 | Sakuma | |
| 7,589,000 B2* | 9/2009 | Kasai et al. | 438/478 |
| 7,655,197 B2* | 2/2010 | Vaudo et al. | 422/292 |
| 2002/0174833 A1 | 11/2002 | Tsvetkov et al. | |
| 2003/0157376 A1* | 8/2003 | Vaudo et al. | 428/698 |
| 2003/0205237 A1 | 11/2003 | Sakuma | |
| 2005/0133812 A1 | 6/2005 | Kim et al. | |
| 2007/0148920 A1* | 6/2007 | Kasai et al. | 438/478 |
| 2008/0191218 A1* | 8/2008 | Kalem | 257/79 |
| 2010/0009526 A1* | 1/2010 | Kasai et al. | 438/503 |

FOREIGN PATENT DOCUMENTS

| | | | |
|---|---|---|---|
| JP | 2007-197302 | | 8/2007 |
| JP | 2007197302 A | * | 8/2007 |
| WO | WO 99/23693 | | 5/1999 |
| WO | WO 00/68471 | | 11/2000 |
| WO | WO 01/68955 A1 | | 9/2001 |

OTHER PUBLICATIONS

Chinese Office Action, w/ English translation thereof, issued in Patent Application No. 200610172517.4 dated on Aug. 29, 2008.

* cited by examiner

FABRICATION METHOD AND FABRICATION APPARATUS OF GROUP III NITRIDE CRYSTAL SUBSTANCE

RELATED APPLICATIONS

This application is a continuation of U.S. application Ser. No. 11/643,675, filed Dec. 22, 2006, now U.S. Pat. No. 7,589,000 which claims the benefit of Japanese Application Nos. JP 2006-218475, filed Aug. 10, 2006 and JP 2005-379917, filed Dec. 28, 2005, the entire contents of each of which are hereby incorporated by reference.

BACKGROUND OF THE INVENTION

1. Field of the Invention

The present invention relates to a fabrication method and fabrication apparatus of a group III nitride crystal substance extensively employed in substrates and the like of various semiconductor devices. More particularly, the present invention relates to a fabrication method of a group III nitride crystal substance including a method for effectively cleaning deposits adhering in a reaction chamber during growth of a group III nitride crystal substance, and a fabrication apparatus employed in this fabrication method.

2. Description of the Background Art

Group III nitride crystal substances such as GaN crystal substances and AlN crystal substances are extremely useful for the substrate of various semiconductor devices such as a light emitting element, electronic element, semiconductor sensor, and the like. The fabrication method of a group III nitride crystal substance includes various types of vapor deposition such as hydride vapor phase epitaxy (hereinafter, also referred to as HVPE), metal-organic chloride vapor phase epitaxy (hereinafter, also referred to as MOC), metal-organic chemical vapor deposition (hereinafter, also referred to as MOCVD), and the like (for example, refer to the pamphlet of International Publication No. WO99/23693).

All of the aforementioned vapor deposition methods cause deposits formed of polycrystalline group III nitride to adhere to the interior of the reaction chamber, particularly at the crystal growth zone and the raw material introduction zone, when a group III nitride crystal substance is grown on the underlying substrate in the reaction chamber. Such deposits must be removed since they may prevent stable supply of raw material, and/or be mixed into the group III nitride crystal substance that is to be grown subsequently.

In order to remove such deposits, the reactor tube constituting the reaction chamber was discarded after one use, or the interior of the reaction chamber had to be rinsed with solution such as phosphoric acid, sulfuric acid, sodium hydroxide, potassium hydroxide, and the like. Usage of a disposable reaction tube is disadvantageous since the reaction tube is expensive and a pre-baking step (a heating process of the reaction chamber prior to crystal growth; the same applies hereinafter) is required, leading to degradation in fabrication efficiency and increase in fabrication cost. If the interior of the reaction chamber is rinsed with solution such as phosphoric acid, sulfuric acid, sodium hydroxide, potassium hydroxide, and the like, the atoms of at least any of phosphorus, sulfur, sodium, potassium, and oxygen included in the solution will remain in the reaction chamber to be mixed in the crystal to be grown subsequently.

SUMMARY OF THE INVENTION

In view of the foregoing, an object of the present invention is to provide a fabrication method of a group III nitride crystal substance including a method for effectively cleaning deposits adhering to the interior of the reaction chamber during crystal growth, and a fabrication apparatus employed in such a fabrication method.

The present invention corresponds to a fabrication method of a group III nitride crystal substance including the steps of cleaning the interior of a reaction chamber by introducing HCl gas into the reaction chamber, and vapor deposition of a group III nitride crystal substance in the cleaned reaction chamber.

In the group III nitride crystal substance fabrication method of the present invention, the step of cleaning the interior of the reaction chamber can be carried out under the conditions that the HCl gas partial pressure is at least 1.013 hPa and not more than 1013 hPa (at least 0.001 atm and not more than 1 atm), and the temperature in the reaction chamber is at least 650° C. and not more than 1200° C.

A fabrication apparatus of a group III nitride crystal substance employed in the fabrication method set forth above of the present invention includes a reaction chamber formed in a reactor tube, a group III element raw material gas generation chamber, an HCl gas introduction pipe to introduce HCl gas into the reaction chamber, an HCl gas introduction pipe to introduce HCl gas to the group III element raw material gas generation chamber, a group III element raw material gas introduction pipe to introduce the group III raw material gas generated at the group III element raw material gas generation chamber into the reaction chamber, a nitrogen raw material gas introduction pipe to introduce nitrogen raw material gas into the reaction chamber, a gas exhaust pipe to discharge gas from the reaction chamber, and a substrate holder to dispose an underlying substrate to grow a group III nitride crystal substance in the reaction chamber.

In the group III nitride crystal substance fabrication apparatus of the present invention, the reaction chamber includes a crystal growth zone that is the region in close proximity to substrate holder 119. A protection member of the reaction chamber can be disposed on the inner wall of the reaction chamber at this crystal growth zone. Further, a device to trap ammonium chloride can be attached at the inlet and/or outlet of the gas exhaust pipe.

In accordance with the present invention, a fabrication method of a group III nitride crystal substance including a method for effectively cleaning deposits adhering to the interior of the reaction chamber during crystal growth, and a fabrication apparatus employed in the fabrication method can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
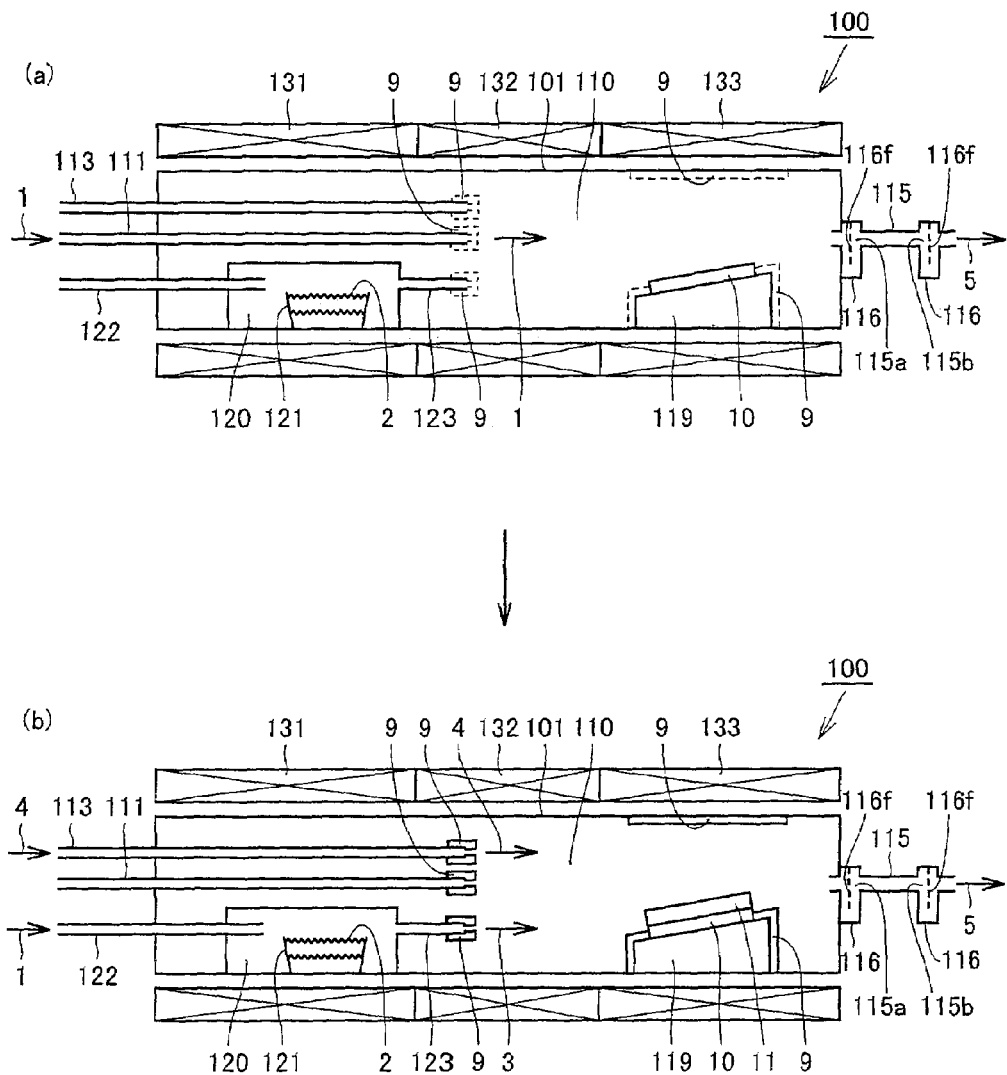
FIG. 1 is a schematic sectional view representing an embodiment of a fabrication method and fabrication apparatus of a group III nitride crystal substance of the present invention, wherein (a) corresponds to the step of cleaning the interior of the reaction chamber by introducing HCl gas into the reaction chamber, and (b) corresponds to the step of vapor deposition of a group III nitride crystal substance in the cleaned reaction chamber.

Referring to FIG. 1, an embodiment of a fabrication method of a group III nitride crystal substance of the present invention includes the step of cleaning the interior of a reaction chamber 110 by introducing HCl gas 1 into reaction chamber 110, as shown in (a), and the step of vapor deposition of a group III nitride crystal substance 11 in the cleaned reaction chamber 110, as shown in (b).

Referring to (a) and (b) in FIG. 1, the inventors found that deposits 9 formed of polycrystalline group III nitride accumulated inside reaction chamber 110 during growth of a group III nitride crystal substance 11 (specifically, at the inner wall of a reactor tube 101 constituting reaction chamber 110, and at the ends of group III element raw material gas introduction pipe 123, nitrogen raw material gas introduction pipe 113, HCl gas introduction pipe 111, and the like) are etched away by HCl gas 1. The inventors used HCl gas 1 for cleaning the interior of reaction chamber 110 to complete the present invention.

For example, GaN identified as group III nitride reacts with HCl gas, as set forth in the following equations of (1)-(3):

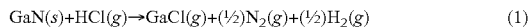
$$GaN(s) + HCl(g) \rightarrow GaCl(g) + (1/2)N_2(g) + (1/2)H_2(g) \qquad (1)$$

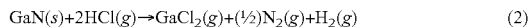
$$GaN(s) + 2HCl(g) \rightarrow GaCl_2(g) + (1/2)N_2(g) + H_2(g) \qquad (2)$$

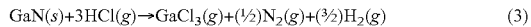
$$GaN(s) + 3HCl(g) \rightarrow GaCl_3(g) + (1/2)N_2(g) + (3/2)H_2(g) \qquad (3)$$

and is converted into GaCl gas, GaCl$_2$ gas or GaCl$_3$ gas to be removed. The same can be said for group III nitride crystal substances other than GaN such as AlN.

Referring to FIG. 1(b), during growth of a group III nitride crystal substance, deposits 9 formed of polycrystalline group III nitride adhere to the interior of reaction chamber 110, particularly to the ends of group III element raw material gas introduction pipe 123, nitrogen raw material gas introduction pipe 113, and HCl gas introduction pipe 111, and also to the inner wall of reactor tube 101 at the crystal growth zone (the zone in the proximity to substrate holder 119 for crystal growth, mainly the zone heated by a heater 133; the same implies hereinafter).

In the step of cleaning the interior of a reaction chamber 110 by introducing HCl gas 1 into reaction chamber 110 corresponding to FIG. 1(a), HCl gas 1 is introduced into reaction chamber 110 contaminated with adhering deposits 9 via HCl gas introduction pipe 111. At this stage, carrier gas is additionally used to deliver the HCl gas efficiently, and/or to adjust the partial pressure of HCl gas. H$_2$ gas, N$_2$ gas, Ar gas, He gas and the like can be enumerated as carrier gas. From the standpoint of facilitating removal of deposits 9 formed of polycrystalline group III nitride and the economic aspect, H$_2$ gas is preferable for the carrier gas. Deposits 9 react with HCl gas 1 to generate group III element chloride gas, N$_2$ gas and H$_2$ gas. Such group III element chloride gas, N$_2$ gas and H$_2$ gas are discharged via gas exhaust pipe 115 from reaction chamber 110 to be output as exhaust gas 5, whereby the interior of reaction chamber 110 is cleaned. The opening of HCl gas introduction pipe 111 is preferably located at the leading end of nitrogen raw material gas introduction pipe 113 and group III element raw material gas introduction pipe 123, i.e. upstream of the region where deposits 9 adhere.

With reference to FIG. 1(b), the step of vapor deposition of a group III nitride crystal substance 11 in cleaned reaction chamber 110 is carried out as set forth below. HCl gas 1 is introduced into group III element raw material gas generation chamber 120 via an HCl gas introduction pipe 122. A group III element boat 121 with group III element 2 placed therein is disposed in group III element raw material gas generation chamber 120. Group III element 2 reacts with HCl gas 1 to generate group III element chloride gas qualified as group III element raw material gas 3.

Group III element raw material gas 3 is introduced from group III element raw material gas generation chamber 120 into reaction chamber 110 via group III element raw material gas introduction pipe 123. NH$_3$ gas qualified as nitrogen raw material gas 4 is introduced into reaction chamber 110 via a nitrogen raw material gas introduction pipe 113. In reaction chamber 110, group III element raw material gas 3 and nitrogen raw material gas 4 react, whereby a group III nitride crystal substance 11 is grown on underlying substrate 10 disposed on substrate holder 119 at the crystal growth zone. Excessive gas is discharged from reaction chamber 110 via gas exhaust pipe 115 as exhaust gas 5. At this stage, carrier gas is additionally used to efficiently deliver the group III element raw material gas and nitrogen raw material gas, and/or to adjust the partial pressure of each raw material gas. H$_2$ gas, N$_2$ gas, and the like can be enumerated for the carrier gas.

Deposits 9 formed of polycrystalline group III nitride adhere to the interior of reaction chamber 110. Attachment of deposits 9 at the leading end portions of group III element raw material gas introduction pipe 123, nitrogen raw material gas introduction pipe 113, and HCl gas introduction pipe 111 in reaction chamber 110 will impede supply of raw material gas. It will therefore become difficult to obtain a crystal substance of stable quality, and conduct growth for a long period of time to obtain a thick crystal substance.

By repeating the step of introducing HCl gas into the reaction chamber to clean the interior of the reaction chamber effectively and the step of vapor deposition of a group III nitride crystal substance in the cleaned reaction chamber, cleaning the interior of the reaction chamber and growing a group III nitride crystal substance in vapor phase can be conducted efficiently. Thus, a group III nitride crystal substance of favorable crystallinity can be obtained efficiently.

In the fabrication method of a group III nitride crystal substance of the present embodiment, the step of cleaning the interior of the reaction chamber is preferably carried out under the conditions that the HCl gas pressure is at least 1.013 hPa and not more than 1013 hPa (at least 0.001 atm and not more than 1 atm), and the temperature in the reaction chamber is at least 650° C. and not more than 1200° C. If the HCl gas partial pressure is lower than 1.013 hPa, the removal effect of deposits 9 is degraded. If the partial pressure is higher than 1013 hPa, it will be difficult to discharge the introduced HCl gas from the reaction chamber. Further, if the temperature in the reaction chamber is lower than 650° C., the removal effect of deposits 9 is degraded. If the temperature is higher than 1200° C., the reactor tube constituting the reaction chamber will be deteriorated and/or damaged. In view of the foregoing, the temperature in the reaction chamber is preferably at least 800° C. and more preferably at least 900° C.

In the fabrication method of a group III nitride crystal substance of the present embodiment, the oxygen atom concentration and silicon atom concentration in the group III nitride crystal substance can be adjusted by regulating the temperature at the raw material introduction zone in the reaction chamber in the step of vapor deposition of a group III nitride crystal substance in the cleaned reaction chamber.

In the case where the reactor tube is formed of oxygen-containing material such as quartz, the oxygen atoms and silicon atoms contained in the reactor tube will be mixed into the group III nitride crystal substance during growth thereof. Upon a thermodynamic calculation for the pyrolysis of quartz in a system where $NH_3(g)$ and $H_2(g)$ are brought into contact with quartz $SiO_2(s)$ when the mole ratio of $SiO_2(s):NH_3(g):H_2(g)$ is 1:10:40 and the total pressure of $NH_3(g)$ and $H_2(g)$ is 1013 hPa (1 atm), for example, it was found that moisture ($H_2O(g)$) and Si type gas (for example, $Si_2N_2O(g)$) were generated as the temperature in the reaction chamber rises. The partial pressure of the generated $H_2O(g)$ and Si type gas increases as the temperature in the reaction chamber rises, i.e. the partial pressure is 0.41 Pa ($4 \times 10^{-6}$ atm and 0.10 Pa ($1 \times 10^{-6}$ atm), respectively, at 600° C., and 2.43 Pa ($2.4 \times 10^{-5}$ atm) and 0.61 Pa ($6 \times 10^{-6}$ atm), respectively, at 1000° C. The oxygen atoms in the moisture and the silicon atoms in the Si type gas enter the group III nitride crystal substance as impurities.

The temperature in the reaction chamber (hereinafter, also referred to as in-reaction chamber temperature) is adjusted by regulating the temperature at the raw material introduction zone and crystal growth zone. From the standpoint of stably growing a group III nitride crystal substance of favorable crystallinity, the crystal growth zone is preferably maintained at approximately 1000° C.-1200° C. Therefore, adjustment of the in-reaction chamber temperature to control the oxygen atom concentration and silicon atom concentration can be conducted in practice mainly by adjusting the temperature at the raw material introduction zone (the zone in proximity to the ends of group III element raw material gas introduction pipe 123, nitrogen raw material gas introduction pipe 113 and HCl gas introduction pipe 111; mainly the region heated by heater 132; the same apply hereinafter), instead of adjusting the temperature at the crystal growth zone, or by disposing a quartz component in the reaction chamber and heating the same. The crystal growth zone refers to the region where a group III nitride crystal substance is to be grown, and the region heated by heater 133 in reaction chamber 110 in FIG. 1.

When a GaN crystal substance is to be grown as a group III nitride crystal substance, the temperature in group III element raw material gas generation chamber 120 and the raw material introduction zone is preferably adjusted in the range of at least 650° C. and not more than 1200° C. If the temperature in group III element raw material gas generation chamber 120 is lower than 650° C., reaction between HCl gas 1 and metal Ga (group III element 2) is degraded, such that introduction of GaCl gas (group III element raw material gas 3) into reaction chamber 110 is impeded. If the temperature at the raw material introduction zone is higher than 1200° C., degradation and/or damage of the quartz component and the like will readily occur, Second Embodiment Referring to FIG. 1, an embodiment of a fabrication apparatus of a group III nitride crystal substance (fabrication apparatus 100) of the present invention includes a reaction chamber 110 formed in a reactor tube 101, a group III element raw material gas generation chamber 120, an HCl gas introduction pipe 111 to introduce HCl gas 1 into reaction chamber 110, an HCl gas introduction pipe 122 to introduce HCl gas 1 into group III element raw material gas generation chamber 120, a group III element raw material gas introduction pipe 123 to introduce group III raw material gas 3 generated at group III element raw material gas generation chamber 120 to reaction chamber 110, a nitrogen raw material gas introduction pipe 113 to introduce nitrogen raw material gas 4 into reaction chamber 110, a gas exhaust pipe 115 to discharge gas from reaction chamber 110, and a substrate holder 119 to dispose an underlying substrate 10 to grow a group III nitride crystal substance 11 in reaction chamber 110. By the provision of HCl gas introduction pipe 111 to introduce HCl gas 1 into reaction chamber 110, HCl gas can be directly introduced into reaction chamber 110 without the passage of another chamber when a group III nitride crystal substance 11 is to be grown. Therefore, deposits 9 formed of polycrystalline group III nitride adhering to the interior of reaction chamber 110 can be removed efficiently in vapor phase.

In fabrication apparatus 100 of the present embodiment, HCl gas introduction pipe 111 to introduce HCl gas 1 into reaction chamber 110 corresponds to the configuration of introducing HCl gas 1 into reaction chamber 110, and components other than HCl gas introduction pipe 111 to introduce HCl gas 1 into reaction chamber 1 correspond to the configuration of growing a group III nitride crystal substance 11 by HVPE. In other words, fabrication apparatus 100 of the present embodiment includes a configuration of introducing HCl gas into the reaction chamber, and a configuration of growing a group III nitride crystal substance by HVPE. As used herein, HVPE refers to the method of growing a group III nitride crystal substance in vapor phase based on the reaction between group III element chlorine gas qualified as the group III element raw material gas, and $NH_2$ gas qualified as the nitrogen raw material gas. The apparatus to grow a crystal substance by HVPE is referred to as the "HVPE apparatus".

Referring to FIG. 1, for example, group III nitride crystal substance fabrication apparatus 100 of the present embodiment includes reaction chamber 110, group III element raw material gas generation chamber 120, and heaters 131, 132 and 133 to heat reaction chamber 110 and group III element raw material gas generation chamber 120. Reaction chamber 110 and group III element raw material gas generation chamber 120 have HCl gas introduction pipe 122 arranged to introduce HCl gas 1 into group III element raw material gas generation chamber 120. In group III element raw material gas generation chamber 120, a group III element boat 121 in which group III element 2 is placed is disposed therein. Group III element raw material gas generation chamber 120 has a group III element raw material gas introduction pipe 123 arranged to deliver the generated group III element raw material gas 3 into reaction chamber 110. Reaction chamber 110 is provided with nitrogen raw material gas introduction pipe 113 to introduce nitrogen raw material gas 4 into reaction chamber 110, and gas exhaust pipe 115 to discharge gas 5 from reaction chamber 110. Substrate holder 119 to dispose an underlying substrate 10 for growth of a group III nitride crystal substance 11 is arranged in reaction chamber 110. From the standpoint of readily producing a large reactor tube, reactor tube 101 constituting reaction chamber 110 is preferably, but not particularly limited to, a quartz reactor tube.

During the step of growing a crystal substance or cleaning the interior of the reaction chamber, ammonium chloride ($NH_4Cl$) powder is generated as a by-product. Since the powder may block gas exhaust pipe 115 to impede continuous crystal growth of long duration, i.e. impede growth of a thick crystal substance, it is preferable to attach a device 116 that traps ammonium chloride (hereinafter, also referred to as trap device 116) at an inlet 115a and/or an outlet 115b of gas exhaust pipe 115. Ammonium chloride is generated when HCl and NH$_3$ are present at the temperature of below approximately 340° C. The form thereof is powder. It is preferable to cool the interior of trap device 116. Although this may be conducted by air-cooling or water-cooling, the air-cooling approach is preferable from the standpoint of maintenance. A filter 116f may be installed in trap device 116. Trap device 116 is configured to obviate clogging at the inlet and outlet of gas exhaust pipe 115. For example, trap device 116 is preferably configured such that the gas inlet and outlet is located at the upper portion of trap device 116, and the lower portion of trap device 116 corresponds to a deep concave for accumulation of ammonium chloride powder.

Third Embodiment

Figure 2:
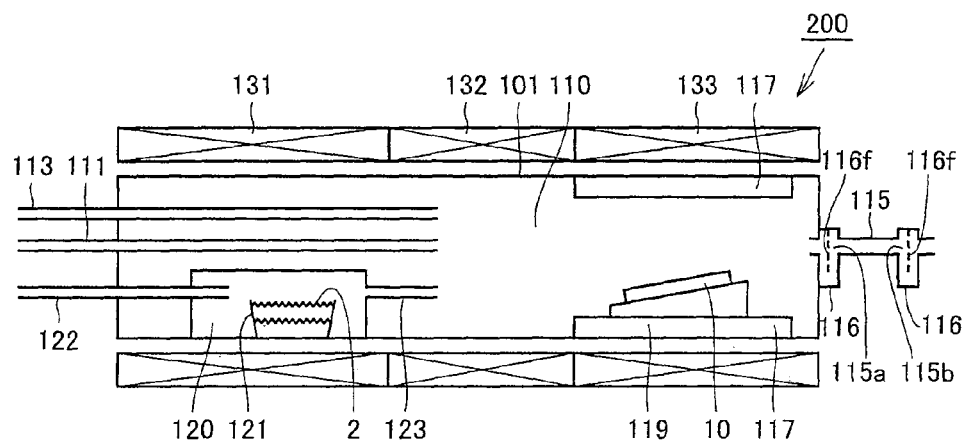
FIG. 2 is a schematic sectional view of a group III nitride crystal substance fabrication apparatus according to another embodiment of the present invention.

Referring to FIG. 2, another embodiment of a group III nitride crystal substance fabrication apparatus (fabrication apparatus 200) of the present invention has a protection member 112 for the reaction chamber arranged on the inner wall of reactor tube 101 at the crystal growth zone located in proximity to substrate holder 119 in reaction chamber 110 corresponding to fabrication apparatus 100 of a group III nitride crystal substance of the second embodiment shown in FIG. 1. Protection member 117 may be brought into intimate contact with the inner wall of reactor tube 101, as shown in FIG. 2, or disposed apart from the inner wall of reactor tube 101.

At the crystal growth zone of reaction chamber 110, the temperature becomes as high as appropriately 1000° C.-1200° C. during crystal growth. The inner wall of reactor tube 101 in the proximity of the crystal growth zone in reaction chamber 110 attains a temperature equal to that of the crystal growth zone, corresponding to an environment of facilitating crystal generation. Therefore, a large amount of polycrystalline group III nitride (for example, polycrystalline GaN when GaN crystal substance is grown; polycrystalline AlN when AlN crystal substance is grown) adheres to the inner wall of reactor tube 101 in the proximity of the crystal growth zone. In the case where reactor tube 101 is formed of oxygen-containing material such as quartz, the reactor tube reacts with the NH$_3$ gas qualified as the nitrogen raw material gas and/or H$_2$ gas qualified as the carrier gas to generate moisture. As a result, oxygen atoms will be mixed into the group III nitride crystal substance to degrade and damage reactor tube 101.

The provision of protection member 117 for reactor tube 101 at the inner wall of reactor tube 101 at the crystal growth zone of reaction chamber 110 suppresses the contact between the quartz of reactor tube 101 and the raw material gas and/or hydrogen gas at the crystal growth zone. Therefore, adherence of polycrystalline group III nitride deposits onto the inner wall of reactor tube 101 at the crystal growth zone as well as the degradation and damage of reactor tube 101 can be suppressed. Even if the quartz (SiO$_2$) of reactor tube 101 is decomposed at the crystal growth zone, gas including oxygen atoms and silicon atoms will not reach the crystal growth zone since the group III nitride crystal growth zone is separated from the SiO$_2$ decomposition region by protection member 117. Thus, introduction of oxygen atoms and silicon atoms into a group III nitride crystal substance 11 as well as degradation and damage of reactor tube 101 can be suppressed. From the standpoint of suppressing introduction of oxygen atoms into the group III nitride crystal substance as well as degradation and damage of reactor tube 101, protection member 117 is preferably formed of, but not limited to, a substance other than oxide such as pBN (pyrolitic boron nitride), carbon, SiC, WC, TaC, and the like. Likewise the second embodiment, a device 116 to trap ammonia chloride is preferably provided at inlet 115a and/or outlet 115b of gas exhaust pipe 115. Further, trap device 116 may be provided with filter 116f, likewise the second embodiment.

Fourth Embodiment

Figure 3:
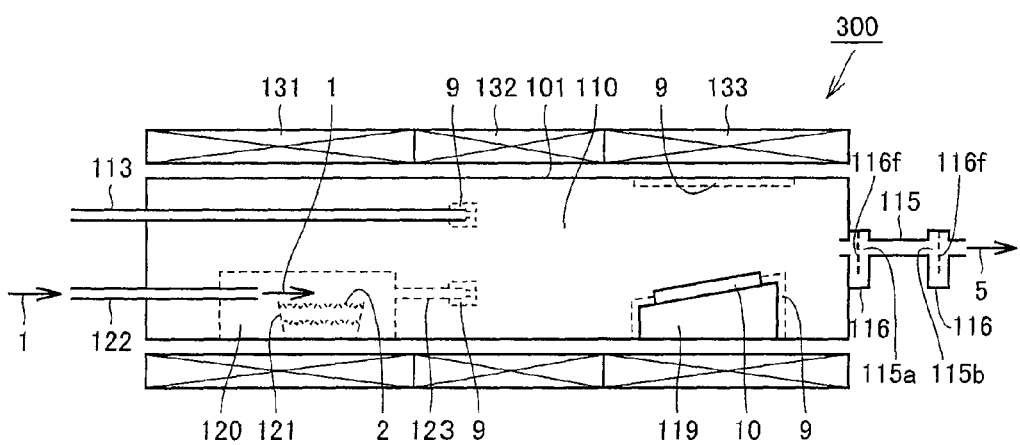
FIG. 3 is a schematic sectional view of a group III nitride crystal substance fabrication method according to a further embodiment of the present invention.

Referring to FIG. 3, another embodiment of a group III nitride crystal substance fabrication method of the present invention is directed to the step of cleaning the interior of reaction chamber 110 by introducing HCl gas into reaction chamber 110 via HCL gas introduction pipe 122 after group III element raw material gas generation chamber 120 and group III element raw material gas introduction pipe 123 are removed from reaction chamber 110 in fabrication apparatus 300. The removed group III element raw material gas generation chamber 120 and group III element raw material gas introduction pipe 123 are cleaned separately by vapor phase etching using HCl gas or by liquid phase etching using phosphoric acid, sulfuric acid, and the like.

The cleaned group III element raw material gas generation chamber 120 and group III element raw material gas introduction pipe 123 are attached again to the cleaned reaction chamber 110. Then, a group III nitride crystal substance is grown in the cleaned reaction chamber 110.

In accordance with the step of cleaning the interior of the reaction chamber according to the fourth embodiment, HCl gas 1 can be introduced into reaction chamber 110 by means of HCl gas introduction pipe 122 introducing HCl gas into the group III element raw material gas reaction chamber in the step of growing a group III nitride crystal substance. Therefore, HCl gas introduction pipe 111 to introduce HCl gas 1 into reaction chamber 110 as in fabrication apparatus 100 of FIG. 1 is dispensable. However, group III element raw material gas generation chamber 120 and group III element raw material gas introduction pipe 123 must be cleaned otherwise. In fabrication apparatus 300 of the present embodiment, a device 116 to trap ammonia chloride is preferably provided at inlet 115a and/or outlet 115b of gas exhaust pipe 115. Further, trap device 116 may be provided with filter 116f, likewise the second embodiment.

The first to fourth embodiments were described based on HVPE. The present invention is preferably applicable to vapor deposition methods other than HVPE such as MOC or MOCVD. The MOC method includes the step of effecting reaction between organic metal compound gas of a group III element and HCl gas to generate group III element chloride gas, qualified as group III element raw material gas, and then effecting reaction between the group III element chloride gas and NH$_3$ gas qualified as nitrogen raw material gas to grow a group III nitride crystal substance with vapor phase. The MOCVD method includes the step of effecting reaction between organic metal compound gas of a group III element and NH$_3$ gas qualified as nitrogen raw material gas to grow a group III nitride crystal substance with vapor phase.

Comparative Example 1

Figure 4:
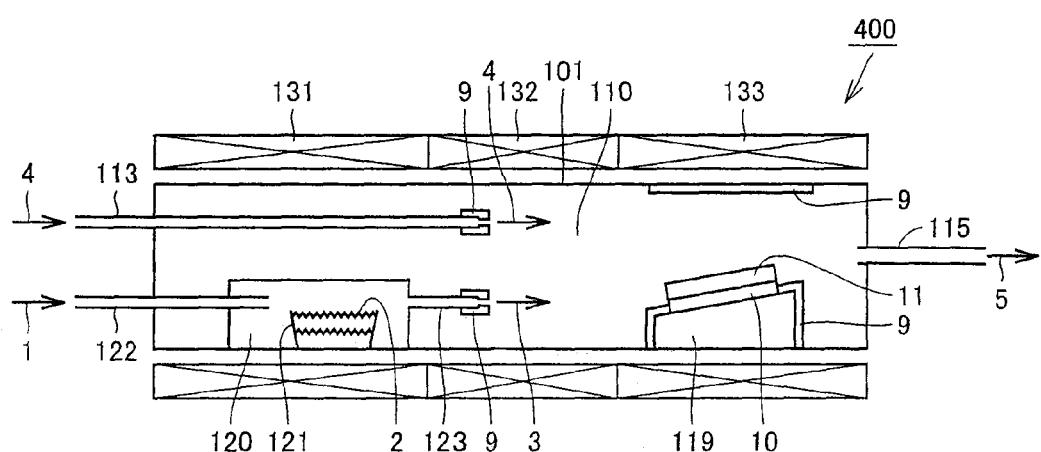
FIG. 4 is a schematic sectional view of a general group III nitride crystal substance fabrication apparatus.

A GaN crystal substance was grown using a general fabrication apparatus 400 of a group III nitride crystal substance shown in FIG. 4. Crystal growth was conducted by fabrication apparatus 400, absent of a device for trapping ammonia chloride (trap device) at gas exhaust pipe 115. First, a new quartz reactor tube 101 constituting reaction chamber 110 was set in fabrication apparatus 400. In order to remove any impurities such as moisture adhered to quartz reactor tube 101, pre-baking was conducted for 50 hours at 1050° C. while supplying a flow of $N_2$ gas in reaction chamber 110.

Then, a (0001) sapphire substrate (a sapphire substrate with the (0001) plane as the crystal growing plane; the same applies hereinafter) of 50.8 mm in diameter was set as underlying substrate 10 in reaction chamber 110. A GaN crystal substance (group III nitride crystal substance 11) was grown on underlying substrate 10 for 15 hours under the conditions of 850° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure (first crystal growth). Crystal growth was conducted using a substrate of 50.8 mm in diameter in the comparative examples and examples of the present invention set forth below. The obtained GaN crystal substance exhibiting an uneven surface was approximately 1.7 mm in thickness with brown transparency. The periphery of the obtained GaN crystal substance had polycrystalline GaN adhered thereto.

After the polycrystalline GaN at the periphery of the GaN crystal substance was removed by peripheral grinding, the surface was ground and polished to be smooth. No cracks were observed during the process of peripheral grinding, surface grinding, and polishing. The smoothed surface of the GaN crystal substance was observing with visible light using a fluorescent microscope. A light domain and a dark domain were observed. The dark domain indicates the region where the crystal grows at the facet of the (11-22) plane and the like (hereinafter, referred to as the facet growth domain). The light domain indicates the region where the crystal grows at the (0001) plane (hereinafter, referred to as the C-plane growth domain). By the presence of both the facet growth domain and C-plane growth domain in crystal growth, dislocations can be gathered at the region extending from the vertex of the concave pit formed of a plurality of facets perpendicularly inward of the crystal with respect to the C-plane. The dislocation density at a region other than this dislocation gathering region can be reduced. Formation of such a facet growth domain is facilitated as the crystal growth temperature becomes lower, or as the ratio of the partial pressure of group III element raw material gas to the partial pressure of the nitrogen raw material gas becomes lower.

The impurity concentration at the facet growth domain of the GaN crystal substance was measured by SIMS (Secondary Ion Mass Spectroscopy). H atoms, C atoms, Si atoms, and O atoms were observed as impurities. The concentration of the H atoms, C atoms, and Si atoms were all below $1.0 \times 10^{17}$ $cm^{-3}$. The concentration of O atoms was $1.2 \times 10^{-17}$ $cm^{-3}$. With regards to the impurity concentration at the C-plane growth domain of the GaN crystal substance, the impurity concentration was below $1.0 \times 10^{17}$ $cm^{-3}$ for the O, H, and C atoms, and $1.0 \times 10^{18}$ $cm^{-3}$ for the Si atoms.

In reaction chamber 110 subsequent to this GaN crystal substance growth, particularly at the inner wall of quartz reactor tube 101 at the crystal growth zone and at the ends of group III element raw material gas introduction pipe 123 and nitrogen raw material gas introduction pipe 113 at the raw material introduction zone, attachment of deposits 9 formed of polycrystalline GaN, approximately 0.3-0.7 mm in thickness, was observed. Further, ammonium chloride was deposited on the inner wall of gas exhaust pipe 115 to a thickness of approximately 2-4 mm.

Using this quartz reactor tube 101 as reaction chamber 110, a GaN crystal substance was grown again (second crystal growth) under conditions identical to those of the first crystal growth. The obtained GaN crystal substance exhibiting an uneven surface was approximately 1 mm in thickness with brown transparency, thinner than the first grown GaN crystal substance. The periphery of the obtained GaN crystal substance had polycrystalline GaN adhered thereto. The concentration of O atoms and Si atoms at the facet growth domain of this GaN crystal substance was $1.2 \times 10^{19}$ $cm^{-3}$ and below $1.0 \times 10^{17}$ $cm^{-8}$, respectively. The concentration of the O atoms and Si atoms at the C-plane growth domain was below $1.0 \times 10^{17}$ $cm^{-3}$ and $1.1 \times 10^{18}$ $cm^{-3}$, respectively. In the assessment, the same process as set forth above was applied. However, no cracks were observed.

The thickness of deposits 9 formed inside reaction chamber 110 subsequent to the second crystal growth, particularly at the inner wall of quartz reactor tube 101 at the crystal growth zone and the ends of group III element raw material gas introduction pipe 123 and nitrogen raw material gas introduction pipe 113 at the raw material introduction zone was 1.1-2.4 mm. It is assumed that deposits at least two times the thickness of the first crystal growth were accumulated at the second crystal growth. Further, ammonium chloride was deposited on the inner wall of gas exhaust pipe 115 to a thickness of at least two times that of the first crystal growth during the second crystal growth. It was found that, in the second crystal growth, more Ga material and nitrogen material became deposits 9, and the growth rate of the GaN crystal substance was degraded by the clogging at gas exhaust pipe 115, as compared to the first crystal growth.

Comparative Example 2

Deposits 9 of approximately 1.1-2.4 mm in thickness were attached inside reaction chamber 110, and ammonium chloride of approximately 5-10 mm in thickness was attached at the inner wall of gas exhaust pipe 115, subsequent to the second crystal growth in Comparative Example 1. This quartz reactor tube 101 contaminated with deposits 9 was removed from fabrication apparatus 400 and dipped in a mixed solution of phosphoric acid and sulfuric acid under the mole ratio of 1:1 (solution temperature 180° C.) to be etched for 24 hours to be cleaned (cleaning of quartz reactor tube by liquid phase etching). The remaining deposits were reduced to the thickness of 1.0 mm by etching relative to the thickness of 2.4 mm prior to etching. In this context, the etching rate of the deposits can be estimated as approximately 60 μm/hr. This quartz reactor tube 101 with deposits still remaining was further subjected to etching for 24 hours under the same conditions to remove the remaining deposits. Additionally, gas exhaust pipe 115 contaminated with ammonium chloride was cleaned with water to remove the adhering ammonium chloride.

Quartz rector tube 101 cleaned as set forth above was set in fabrication apparatus 400 as reaction chamber 110, and then subjected to pre-baking for 50 hours at 1050° C. while supplying a flow of $N_2$ gas into reaction chamber 110 to remove moisture adhering to the inner wall of quartz reactor tube 101.

Then, a (0001) sapphire substrate was set in reaction chamber 110 as underlying substrate 10. A GaN crystal substance (group III nitride crystal substance 11) was grown on underlying substrate 10 for 15 hours under the conditions of 850° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure.

The obtained GaN crystal substance exhibiting an uneven surface was approximately 1.7 mm in thickness with darker brown transparency as compared with the GaN crystal substance grown at Comparison Example 1. The periphery of the obtained GaN crystal substance had polycrystalline GaN adhered thereto. A crack of approximately several ten to several hundred μm in length was observed at the interface between the polycrystalline portion and the single crystal portion. For oxygen concentration analysis, a process similar to that of Comparative Example 1 was conducted. The crystal substance subjected to this process had small cracks of approximately several ten to several hundred μm in length in addition to the crack identified prior to the process. The impurity concentration of the GaN crystal substance was evaluated avoiding the region of the small cracks. The GaN crystal substance had a facet growth domain and a C-plane growth domain. The concentration of O atoms and Si atoms at the facet growth domain was $3.5 \times 10^{19}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $2.0 \times 10^{18}$ cm$^{-3}$, respectively. Since the concentration of oxygen atoms identified as impurities in the GaN crystal substance was higher than that of the GaN crystal substance grown in Comparative Example 1, it is assumed that pre-baking of approximately 50 hours at 1050° C. is not sufficient in the case of cleaning by liquid phase etching as in the present comparative example. The generation of cracks not observed in Comparative Example 1 indicates that the crystal substance has become brittle by the hardening due to impurities corresponding to the higher oxygen concentration.

Example 1

A GaN crystal substance was grown using a group III nitride crystal substance fabrication apparatus 100 according to the present invention shown in FIG. 1. Crystal growth was conducted without providing a device to trap ammonium chloride (trap device 116) in fabrication apparatus 100. First, a new quartz reactor tube 101 constituting reaction chamber 110 was set in fabrication apparatus 100. In order to remove impurities such as moisture in quartz reactor tube 101, pre-baking was conducted for 50 hours at the temperature of 1050° C. in the reaction chamber while supplying a flow of N$_2$ gas in reaction chamber 110. Then, a (0001) sapphire substrate of 50.8 mm in diameter was set as underlying substrate 10 in reaction chamber 110. A GaN crystal substance (group III nitride crystal substance 11) was grown on underlying substrate 10 for 15 hours under the conditions of 850° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the NH$_3$ gas partial pressure. The obtained GaN crystal substance had a facet growth domain and a C-plane growth domain. The concentration of O atoms and Si atoms at the facet growth domain was $1.2 \times 10^{19}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $1.0 \times 10^{18}$ cm$^{-3}$, respectively.

In reaction chamber 110 subsequent to this GaN crystal growth, particularly at the inner wall of quartz reactor tube 101 at the crystal growth zone and at the ends of group III element raw material gas introduction pipe 123, nitrogen raw material gas introduction pipe 113, and HCl gas introduction pipe 111 at the raw material introduction zone, attachment of deposits 9 formed of polycrystalline GaN, approximately 0.3-0.7 mm in thickness, was observed. Further, ammonium chloride was deposited on the inner wall of gas exhaust pipe 115 to a thickness of approximately 2-4 mm.

HCl gas 1 and H$_2$ gas (carrier gas) were introduced via HCl gas introduction pipe 111 into reaction chamber 110 contaminated with deposits 9 to conduct etching for 5 hours at the temperature of 1000° C. in the reaction chamber, whereby the interior of reaction chamber 110 was cleaned (cleaning by vapor phase etching). At this stage, the partial pressure of HCl gas 1 was 50.65 hPa (0.05 atm). As a result, deposits 9 in reaction chamber 110 were completely removed by the vapor phase etching. From an additional vapor phase etching experiment, it was estimated that the etching rate of deposits 9 under the present conditions was approximately 500 μm/hr. Ammonium chloride adhered to gas exhaust pipe 115.

Then, a (0001) sapphire substrate was set as underlying substrate 10 in reaction chamber 110. A GaN crystal substance (group III nitride crystal substance 11) was grown on underlying substrate 10 for 15 hours under the conditions of 850° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the NH$_3$ gas partial pressure.

The obtained GaN crystal substance exhibiting an uneven surface had the thickness of approximately 1.7 mm with lighter brown transparency than the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the concentration of O atoms and Si atoms at the facet growth domain of the GaN crystal substance was $6.6 \times 10^{18}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $6.5 \times 10^{17}$ cm$^{-3}$, respectively. No cracks were observed after the growing stage and processing stage.

Example 2

Inside reaction chamber 110 subsequent to the GaN crystal growth of Example 1, deposits 9 of approximately 0.3-0.7 mm in thickness, formed of polycrystalline GaN, were observed. The interior of reaction chamber 110 contaminated with deposits 9 was cleaned by vapor phase etching for 5 hours at the in-chamber temperature of 1000° C. with 50.65 hPa (0.05 atm) for the HCl gas partial pressure and employing N$_2$ gas as the carrier gas. As a result, deposits 9 were completely removed. From an additional vapor phase etching experiment, it was estimated that the etching rate of deposits 9 under the present conditions was approximately 200 nm/hr. The reason why the etching rate is reduced as compared to Example 1 may be due to the fact that the nitrogen gas partial pressure has risen by using N$_2$ gas as the carrier gas to suppress escape and decomposition of nitrogen from the polycrystalline GaN constituting deposits 9.

Then, a device for trapping ammonium chloride (trap device 116) was attached at inlet 115a of gas exhaust pipe 115. The attached trap device 116 is a SUS-made container, designed to trap ammonium chloride in the container. Then, a (0001) sapphire substrate was set as underlying substrate 10 in reaction chamber 110. A GaN crystal substance (group III nitride crystal substance 11) was grown on underlying substrate 10 for 15 hours under the conditions of 850° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure.

The obtained GaN crystal substance exhibiting an uneven surface had the thickness of approximately 1.7 mm with lighter brown transparency than the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain was $6.2 \times 10^{18}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $6.3 \times 10^{17}$ cm$^{-3}$, respectively. No cracks were observed after the growing stage and processing stage. Upon removing and examining trap device 116, ammonium chloride was accumulated in trap device 116, and there was only a thin layer (approximately 0.1-0.2 mm in thickness) of ammonium chloride at gas exhaust pipe 115. Gas exhaust pipe 115 was completely free from clogging.

Example 3

Inside reaction chamber 110 subsequent to the GaN crystal growth of Example 2, deposits 9 of approximately 0.3-0.7 mm in thickness formed of polycrystalline GaN were observed. The interior of reaction chamber 110 contaminated with deposits 9 was cleaned by vapor phase etching for 8 hours at the in-chamber temperature of 850° C. with 50.65 hPa (0.05 atm) for the HCl gas partial pressure and employing $H_2$ gas as the carrier gas. As a result, deposits 9 were completely removed. From an additional vapor phase etching experiment, it was estimated that the etching rate of deposits 9 under the present conditions was approximately 100 μm/hr.

Then, a (0001) sapphire substrate was set as underlying substrate 10 in reaction chamber 110. A GaN crystal substance (group III nitride crystal substance 11) was grown on underlying substrate 10 for 15 hours under the conditions of 850° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure.

The obtained GaN crystal substance exhibiting an uneven surface had the thickness of approximately 1.7 mm with lighter brown transparency than the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain of the GaN crystal substance was $6.0 \times 10^{18}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $6.2 \times 10^{17}$ cm$^{-3}$, respectively. No cracks were observed after the growing stage and processing stage.

There was a tendency for slight reduction in the concentration of oxygen atoms identified as impurities in the GaN crystal substance in proportion to the increased times of crystal growth, as shown in Examples 1, 2 and 3 set forth above. This is probably because of the fact that impurities including oxygen atoms such as $H_2O$ or CO in the used quartz reactor tube 101 are gradually reduced. Another possible reason is that the inner wall of the quartz reactor tube with unevenness at the surface at the start of usage corresponds to a larger area of reaction with the nitrogen raw material gas such as $NH_3$, which is reduced as a result of the surface of the inner wall rendered smooth by the etching and/or high temperature atmosphere during usage.

Hall measurement was conducted at room temperature (25° C.) for the GaN crystal substances obtained at Examples 1, 2 and 3. The oxygen concentration obtained by SIMS and the carrier concentration identified by Hall measurement substantially matched each other. It was identified that the carrier in the GaN crystal substances relate to the oxygen atoms that are impurities in the crystal substance.

Example 4

A GaN crystal substance was grown using group III nitride crystal substance fabrication apparatus 100 according to the present invention shown in FIG. 1. First, a new quartz reactor tube 101 constituting reaction chamber 110 was set in fabrication apparatus 100. In order to remove impurities such as moisture in quartz reactor tube 101, pre-baking was conducted for 50 hours at the temperature of 1050° C. while supplying a flow of $N_2$ gas in reaction chamber 110. Then, a (0001) sapphire substrate was set as underlying substrate 10 in reaction chamber 110. A GaN crystal substance (group III nitride crystal substance 11) was grown on underlying substrate 10 for 15 hours under the conditions of 850° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure. The obtained GaN crystal substance had a facet growth domain and a C-plane growth domain. The concentration of O atoms and Si atoms at the facet growth domain was $1.2 \times 10^{19}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $6.9 \times 10^{17}$ cm$^{-3}$, respectively.

In reaction chamber 110 subsequent to this GaN crystal growth, particularly at the inner wall of quartz reactor tube 101 at the crystal growth zone and at the ends of group III element raw material gas introduction pipe 123, nitrogen raw material gas introduction pipe 113, and HCl gas introduction pipe 111 at the raw material introduction zone, attachment of deposits 9 formed of polycrystalline GaN, approximately 0.3-0.7 mm in thickness, was observed.

HCl gas 1 and $H_2$ gas (carrier gas) were introduced via HCl gas introduction pipe 111 into reaction chamber 110 contaminated with deposits 9 to conduct etching for 10 hours at the temperature of 800° C. in the reaction chamber, where by the interior of reaction chamber 110 was cleaned (cleaning by vapor phase etching). At this stage, the partial pressure of HCl gas 1 was 50.65 hPa (0.05 atm). As a result, deposits 9 in reaction chamber 110 were completely removed by the vapor phase etching. From an additional vapor phase etching experiment, it was estimated that the etching rate of deposits 9 under the present conditions was approximately 80 μm/hr.

Then, a (0001) sapphire substrate was set as underlying substrate 10 in reaction chamber 110. A GaN crystal substance (group III nitride crystal substance 11) was grown on underlying substrate 10 for 15 hours under the conditions of 650° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the NH$_3$ gas partial pressure.

The obtained GaN crystal substance exhibiting an uneven surface had the thickness of approximately 1.5 mm with lighter brown transparency than the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain of the GaN crystal substance was $5.3 \times 10^{18}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $6.7 \times 10^{17}$ cm$^{-3}$, respectively. No cracks were observed after the growing stage and processing stage. The reason why the GaN crystal substance obtained in the present example is thin is probably due to the fact that the generation efficiency of GaCl gas is reduced by setting the temperature at the group III element raw material gas generation chamber to 650° C. This induces no problem in connection with crystal quality and fabrication.

Example 5

Inside reaction chamber 110 subsequent to the GaN crystal growth of Example 4, deposits 9 of approximately 0.3-0.7 mm in thickness formed of polycrystalline GaN were observed. The interior of reaction chamber 110 contaminated with deposits 9 was cleaned by vapor phase etching for 15 hours at the in-chamber temperature of 700° C. with 50.65 hPa (0.05 atm) for the HCl gas and employing H$_2$ gas as the carrier gas. As a result, deposits 9 were completely removed. From an additional vapor phase etching experiment, it was estimated that the etching rate of deposits 9 under the present conditions was approximately 50 μm/hr.

Then, a (0001) sapphire substrate was set as underlying substrate 10 in reaction chamber 110. A GaN crystal substance (group III nitride crystal substance 11) was grown on underlying substrate 10 for 15 hours under the conditions of 750° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the NH$_3$ gas partial pressure.

The obtained GaN crystal substance exhibiting an uneven surface had the thickness of approximately 1.7 mm with lighter brown transparency than the GaN crystal substances grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain of the GaN crystal substance was $5.7 \times 10^{18}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $4.2 \times 10^{17}$ cm$^{-3}$, respectively. No cracks were observed after the growing stage and processing stage. Since the thickness of the GaN crystal substance obtained in the present example was approximately 1.7 mm, equal to those of Examples 1-3, it was identified that the generation efficiency of GaCl gas can be maintained at a high level by setting the temperature at group III element raw material gas generation chamber 120 to at least 750° C.

Example 6

Inside reaction chamber 110 subsequent to the GaN crystal growth of Example 5, deposits 9 of approximately 0.3-0.7 mm in thickness formed of polycrystalline GaN were observed. The interior of reaction chamber 110 contaminated with deposits 9 was cleaned by vapor phase etching for 5 hours at the in-chamber temperature of 900° C. with 50.65 hPa (0.05 atm) for the HCl gas and employing H$_2$ gas as the carrier gas. As a result, deposits 9 were completely removed. From an additional vapor phase etching experiment, it was estimated that the etching rate of deposits 9 under the present conditions was approximately 200 μm/hr.

By comparing the etching rates of Examples 1, 3, 4, 5 and 6, it was identified that the etching rate becomes higher in proportion to a higher etching temperature (the temperature in the reaction chamber during etching; the same applies hereinafter). This is probably because the reaction rate between HCl and GaN, or the decomposition rate of GaN itself becomes higher.

Then, a (0001) sapphire substrate was set as underlying substrate 10 in reaction chamber 110. A GaN crystal substance (group III nitride crystal substance 11) was grown on underlying substrate 10 for 15 hours under the conditions of 1000° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the NH$_3$ gas partial pressure.

The obtained GaN crystal substance exhibiting an uneven surface had the thickness of approximately 1.7 mm with dark brown transparency similar to that of the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain of the GaN crystal substance was $7.8 \times 10^{18}$ cm$^{-3}$ and below $1.0 \times 10^{17}$ cm$^{-3}$, respectively. The concentration of O atoms and Si atoms at the C-plane growth domain was below $1.0 \times 10^{17}$ cm$^{-3}$ and $6.5 \times 10^{17}$ cm$^{-3}$, respectively. No cracks were observed after the growing stage and processing stage.

From Examples 4-6, it was identified that the concentration of oxygen atoms that are impurities in the GaN crystal substance becomes higher when the temperature in reaction chamber 110 other than the crystal growth zone (for example, the temperature at the Ga raw material introduction zone) is raised. This is probably because the amount of moisture generated by the reaction between the quartz of quartz reactor tube 101 constituting reaction chamber 110 and NH$_3$ and H$_2$ gases increases so that more oxygen atoms in the moisture enter the GaN crystal substance. Vapor phase etching was conducted under conditions similar to those of Examples 4-6, with the exception that Ar gas and He gas were employed as the carrier gas. It was identified that an etching rate of similar level to Examples 4-6 was obtained based on H$_2$ gas as the carrier gas.

Example 7

Inside reaction chamber 110 subsequent to the GaN crystal growth of Example 6, deposits 9 of approximately 0.3-0.7 mm in thickness formed of polycrystalline GaN were observed. The interior of reaction chamber 110 contaminated with deposits 9 was cleaned by vapor phase etching for 15 hours at the in-chamber temperature of 1000° C. with 6.078 hPa (0.006 atm) for the HCl gas partial pressure and employing $H_2$ gas as the carrier gas. As a result, deposits 9 were completely removed. From an additional vapor phase etching experiment, it was estimated that the etching rate of deposits 9 under the present conditions was approximately 50 μm/hr.

Then, a (0001) sapphire substrate was set as underlying substrate 10 in reaction chamber 110. In order to prevent attachment of deposits 9 on the inner wall of quartz reactor tube 101 at the crystal growth zone of reaction chamber 110, a pBN-made protection drum was inserted as protection member 117 between quartz reactor tube 101 and underlying substrate 10, as shown in FIG. 2. A GaN crystal substance (group III nitride crystal substance 11) was grown on underlying substrate 10 for 15 hours under the conditions of 1000° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure.

The obtained GaN crystal substance exhibiting an uneven surface had the thickness of approximately 1.7 mm with lighter brown transparency than that of the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain of the GaN crystal substance was $4.7 \times 10^{18}$ $cm^{-3}$ and below $1.0 \times 10^{17}$ $cm^{-3}$, respectively. The concentration of O atoms and Si atoms at the C-plane growth domain was below $1.0 \times 10^{17}$ $cm^{-3}$ and $6.5 \times 10^{17}$ $cm^{-3}$, respectively. No cracks were observed after the growing stage and processing stage.

Example 8

Inside reaction chamber 110 subsequent to the GaN crystal growth of Example 7, deposits 9 of approximately 0.3-0.7 mm in thickness formed of polycrystalline GaN were observed. The interior of reaction chamber 110 contaminated with deposits 9 was cleaned by vapor phase etching for 10 hours at the in-chamber temperature of 1000° C. with 2.156 hPa (0.012 atm) for the HCl gas and employing $H_2$ gas as the carrier gas. As a result, deposits 9 were completely removed. From an additional vapor phase etching experiment, it was estimated that the etching rate of deposits 9 under the present conditions was approximately 100 μm/hr.

Then, a (0001) sapphire substrate was set as underlying substrate 10 in reaction chamber 110. In order to prevent attachment of deposits 9 on the inner wall of quartz reactor tube 101 at the crystal growth zone of reaction chamber 110, carbon-made protection drum was inserted as protection member 117 between quartz reactor tube 101 and underlying substrate 10, as shown in FIG. 2. A GaN crystal substance (group III nitride crystal substance 11) was grown on underlying substrate 10 for 15 hours under the conditions of 1000° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure.

The obtained GaN crystal substance exhibiting an uneven surface had the thickness of approximately 1.7 mm with lighter brown transparency than the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain of the GaN crystal substance was $4.1 \times 10^{18}$ $cm^{-3}$ and below $1.0 \times 10^{17}$ $cm^{-3}$, respectively. The concentration of O atoms and Si atoms at the C-plane growth domain was below $1.0 \times 10^{17}$ $cm^{-3}$ and $6.4 \times 10^{17}$ $cm^{-3}$, respectively. As a result of analyzing the concentration of C atoms by the same method of measurement, the concentration was $2 \times 10^{17}$ $cm^{-3}$, higher than that of Comparative Example 1. It is assumed that the C atoms generated from the carbon protection drum were included in the crystal substance. No cracks were observed after the growing stage and processing stage.

Example 9

Inside reaction chamber 110 subsequent to the GaN crystal growth of Example 8, deposits 9 of approximately 0.3-0.7 mm in thickness formed of polycrystalline GaN were observed. The interior of reaction chamber 110 contaminated with deposits 9 was cleaned by vapor phase etching for 5 hours at the in-chamber temperature of 1000° C. with 202.6 hPa (0.2 atm) for the HCl gas partial pressure and employing $H_2$ gas as the carrier gas. As a result, deposits 9 were completely removed. From an additional vapor phase etching experiment, it was estimated that the etching rate of deposits 9 under the present conditions was approximately 600 μm/hr.

Then, a (0001) sapphire substrate was set as underlying substrate 10 in reaction chamber 110. In order to prevent attachment of deposits 9 on the inner wall of quartz reactor tube 101 at the crystal growth zone of reaction chamber 110, an SiC-made protection drum was inserted as protection member 117 between quartz reactor tube 101 and underlying substrate 10, corresponding to FIG. 2. A GaN crystal substance (group III nitride crystal substance 11) was grown on underlying substrate 10 for 15 hours under the conditions of 1000° C. for the temperature in group III element raw material gas generation chamber 120 and the raw material introduction zone and 1030° C. for the temperature at the crystal growth zone in reaction chamber 110, and 20.26 hPa (0.02 atm) for the HCl gas partial pressure (GaCl gas partial pressure) and 303.9 hPa (0.3 atm) for the $NH_3$ gas partial pressure.

The obtained GaN crystal substance exhibiting an uneven surface had the thickness of approximately 1.7 mm with lighter brown transparency than that of the GaN crystal substance grown in Comparative Examples 1 and 2. The periphery of the obtained GaN crystal substance had polycrystalline GaN adhered thereto, likewise Comparative Examples 1 and 2. As a result of conducting the process and measurement similar to those of Comparative Examples 1 and 2, the GaN crystal substance had a facet growth domain and a C-plane growth domain. The concentration of O atoms and Si atoms at the facet growth domain of the GaN crystal substance was $4.1 \times 10^{18}$ $cm^{-3}$ and below $1.0 \times 10^{17}$ $cm^{-3}$, respectively. The concentration of O atoms and Si atoms at the C-plane growth domain was below $1.0 \times 10^{17}$ cm$^{-3}$ and $7.1 \times 10^{17}$ cm$^{-3}$, respectively. The reason why the concentration of Si atoms at the C-plane growth domain in the present example is higher than that of Example 8 may be due to the Si atoms generated from the SiC employed as protection member 117 entering the GaN crystal substance. No cracks were observed after the growing stage and processing stage.

From the results of Examples 7-9, it was found that a GaN crystal substance of low oxygen concentration was obtained by disposing protection member 117 at the high temperature region in reaction chamber 110, around the crystal growth zone. This is probably due to the fact that, even if the quartz (SiO$_2$) at the crystal growth zone of quartz reactor tube 101 is decomposed, gas including oxygen will not reach the crystal growth zone since the GaN crystal growth zone and SiO$_2$ decomposition region are separated by protection member 117. The gas including oxygen will be exhausted outside from gas exhaust pipe 115, such that the mixture of oxygen atoms into the crystal substance is reduced. Crystal growth was conducted under similar conditions to those of Examples 7-9 with the exception of using a protection member made of WC, TaC, and the like. Effects similar to those of Examples 7-9 were obtained.

Comparative Example 3

An AlN crystal substance was grown using group III nitride crystal substance fabrication apparatus 200 shown in FIG. 2. First, a new quartz reactor tube 101 constituting reaction chamber 110 was set in fabrication apparatus 200. In order to remove any impurities such as moisture adhered to the inner wall of quartz reactor tube 101, pre-baking was conducted for 50 hours at 1050° C. while supplying a flow of N$_2$ gas in reaction chamber 110.

Then, a (0001) sapphire substrate of 50.8 mm in diameter was set as an underlying substrate 10 in reaction chamber 110. A pBN-made protection drum was inserted as protection member 117 between quartz reactor tube 101 and underlying substrate 10. An AlN crystal substance (group III nitride crystal substance 11) was grown on underlying substrate 10 for 10 hours under the conditions of 1000° C. for the temperature in group III element raw material gas generation chamber 120 and the raw material introduction zone and 1100° C. for the temperature at the crystal growth zone in reaction chamber 110, and 5.065 hPa (0.005 atm) for the AlCl$_3$ gas partial pressure and 506.5 hPa (0.5 atm) for the NH$_3$ gas partial pressure. Instead of placing group III element 2 in group III element boat 121 of group III element raw material gas generation chamber 120 as in Comparative Examples 1 and 2 and Examples 1-9, AlCl$_3$ gas obtained by sublimation of solid AlCl$_3$ outside reaction chamber 110 was introduced into reaction chamber 110 via HCl gas introduction pipe 122, group III element raw material gas generation chamber 120 and group III element raw material gas introduction pipe 123.

The obtained AlN crystal substance exhibiting a flat surface with no unevenness had a thickness of approximately 0.9 mm with brown transparency, and had the periphery covered with polycrystalline AlN. As a result of observing the surface of the AlN crystal substance by XRD (X-ray diffraction), the surface was a (0001) plane. In other words, the AlN crystal substance was formed at a region grown with the C-plane (C-plane growth domain).

Upon conducting peripheral grinding on the obtained AlN crystal substance to remove the polycrystalline AlN on the periphery, numerous cracks were generated from the periphery inwardly to impede analysis by SIMS. This peripheral grinding was conducted using a diamond cup wheel as the grindstone. This process was carried out under the conditions of 0.5-1.0 mm/min for the table feed rate, 10±2 rpm for the work rotation speed, and 490 kPa (5 kgf/cm$^2$) for the crystal clamp pressure.

An AlN crystal substance was grown again to a thickness of approximately 0.9 mm under the conditions of the present comparative example. The obtained AlN crystal substance was divided into a single crystal portion of 45 mm in diameter, and an AlN polycrystalline portion of the periphery using a cylindrical grinding apparatus with a cylindrical grinding blade. No cracks were generated. Here, cylindrical grinding was conducted using a diamond electrodeposition drill with a water-soluble coolant. The crystal substance was secured to a holder by wax, and subjected to grinding with 5000-8000 rpm as the rotation speed of the grindstone and 0.5-30 mm/min as the working rate. Then, the surface of the AlN crystal substance was ground and polished to be smooth. At this stage, small cracks of several ten to several hundred microns in length were generated in the AlN crystal substance. The impurity concentration in the AlN crystal substance was measured by SIMS at a region absent of a crack. H atoms, C atoms, Si atoms and O atoms were observed as the impurities in the AlN crystal substance. The concentration of the H atoms and C atoms were both below $1.0 \times 10^{17}$ cm$^{-3}$. The concentration of the O atoms and Si atoms was $6.2 \times 10^{19}$ cm$^{-3}$ and $3.0 \times 10^{17}$ cm$^{-3}$, respectively.

The reason why cracks were generated when peripheral grinding was applied on the previously grown AlN crystal substance may be due to the increased amount of impurities in the crystal substance to render the crystal brittle, as well as the local load caused by polycrystalline AlN dropped during grinding to be located between the AlN crystal substance and grindstone. In contrast, the polycrystalline portion will not be ground by cylindrical grinding applied on the AlN crystal substance later grown. No local load was generated, resulting in a crystal substance absent of a crack.

The thickness of AlN polycrystalline deposits 9 formed inside reaction chamber 110 subsequent to the AlN crystal growth, particularly on the inner wall of quartz reactor tube 101 at the crystal growth zone and the ends of group III element raw material gas introduction pipe 123, nitrogen raw material gas introduction pipe 113, and HCl gas introduction pipe 111 at the raw material introduction zone was approximately 0.1-0.5 mm. This quartz reactor tube 101 contaminated with deposits 9 was removed from the fabrication apparatus and dipped in a mixed solution of phosphoric acid and sulfuric acid under the mole ratio of 1:1 (solution temperature 180° C.) to be etched for 24 hours to be cleaned. Deposits 9 on the inner wall of quartz reactor tube 101 were removed (cleaning of quartz reactor tube by liquid phase etching).

Then, an AlN crystal substance was grown to the thickness of approximately 0.9 mm based on conditions identical to those set forth above. It was observed that the obtained AlN crystal substance had polycrystalline AlN attached at the periphery, and exhibited small cracks. In order to suppress development of the cracks, a 10 mm×10 mm square AlN crystal substance sample for evaluation was cut with polycrystalline AlN still located at the periphery. This sample was ground and polished, and then subjected to SIMS analysis based on a region with no cracks. The concentration of O atoms and Si atoms in this AlN crystal substance sample was $8.5\times10^{19}$ cm$^{-3}$ and $3.0\times10^{17}$ cm$^{-3}$, respectively.

Example 10

Likewise Comparative Example 3, a new quartz reactor tube 101 constituting reaction chamber 110 was set at fabrication apparatus 200, followed by pre-baking of quartz reactor tube 101. Following this pre-baking, an AlN crystal substance was grown, likewise Comparative Example 3. H atoms, C atoms, Si atoms and O atoms were observed as the impurities in the AlN crystal substance. The concentration of the H atoms and C atoms were both below $1.0\times10^{17}$ cm$^{-3}$. The concentration of the O atoms and Si atoms was $6.2\times10^{19}$ cm$^{-3}$ and $3.0\times10^{17}$ cm$^{-3}$, respectively.

The interior of reaction chamber 110 subsequent to AlN crystal growth was observed. Deposits 9 formed of polycrystalline AlN, approximately 0.1-0.5 mm in thickness, adhered to the inner wall of quartz reactor tube 101 at the crystal growth zone and the ends of group III element raw material gas introduction pipe 123, nitrogen raw material introduction pipe 113 and HCl gas introduction pipe 111 at the raw material introduction zone.

HCl gas 1 and H$_2$ gas (carrier gas) were introduced via HCl gas introduction pipe 111 into reaction chamber 110 contaminated with deposits 9 to conduct etching for 5 hours at the in-chamber temperature of 1000° C., whereby the interior of reaction chamber 110 was cleaned (cleaning by vapor phase etching). At this stage, the partial pressure of HCl gas 1 was 50.65 hPa (0.05 atm). As a result, deposits 9 in reaction chamber 110 were completely removed by the vapor phase etching. From an additional vapor phase etching experiment, it was estimated that the etching rate of deposits 9 under the present conditions was approximately 340 µm/hr.

Then, as in Comparative Example 3, a (0001) sapphire substrate (underlying substrate 10) and a pBN-made protection drum (protection member 117) were arranged in reaction chamber 110. An AlN crystal substance was grown under conditions similar to those of Comparative Example 3. The obtained AlN crystal substance had higher transparency and no cracks, as compared to the two AlN crystal substances grown in Comparative Example 3. Peripheral grinding was applied on the AlN crystal substance, leading to the generation of several cracks inwardly from the periphery. A crystal substance of a large size could not be obtained. Peripheral grinding was conducted using a diamond cup wheel as the grindstone. This process was carried out under the conditions of 0.5-1.0 mm/min for the table feed rate, 10±2 rpm for the work rotation speed, and 490 kPa (5 kgf/cm$^2$) for the crystal clamp pressure.

An AlN crystal substance was grown again to a thickness of approximately 0.9 mm under the conditions of the present example (that is, Comparative Example 3). The obtained AlN crystal substance was divided into a single crystal portion of 45 mm in diameter, and an AlN polycrystalline portion of the periphery using a cylindrical grinding apparatus with a cylindrical grinding blade. No cracks were generated. Here, cylindrical grinding was conducted using a diamond electrodeposition drill with a water-soluble coolant. The crystal substance was secured to a holder by wax, and subjected to grinding with 5000-8000 rpm as the rotation speed of the grindstone and 0.5-30 mm/min as the working rate. Then, the surface of the single crystal portion was ground and polished to be smooth. An AlN crystal substance of 45 mm in diameter was obtained, absent of cracks. Here, a (0001) sapphire substrate of 50.8 mm in diameter was used as the underlying substrate for growth, and cylindrical grinding was conducted.

Therefore, an AlN crystal substance smaller than 50.8 mm in diameter (i.e. 45 mm in diameter) was obtained. It is needless to say that an AlN crystal substance having a diameter larger than 50.8 mm subsequent to cylindrical grinding can be obtained by using an underlying substrate having a diameter greater than 50.8 mm (for example, a substrate of 76.2 mm in diameter).

The impurity concentration in the AlN crystal substance subjected to the cylindrical grinding, surface grinding, and polishing set forth above was measured by SIMS. H atoms, C atoms, Si atoms and O atoms were observed as the impurities in the AlN crystal substance. The concentration of the H atoms and C atoms were both below $1.0\times10^{17}$ cm$^{-3}$. The concentration of the O atoms and Si atoms was $6.3\times10^{18}$ cm$^{-3}$ and $1.0\times10^{17}$ cm$^{-3}$, respectively.

Example 11

In reaction chamber 110 subsequent to the AlN crystal growth of Example 10, attachment of deposits 9, approximately 0.1-0.5 mm in thickness, formed of AlN polycrystalline on the internal wall of the protection drum and the ends of group III element raw material gas introduction pipe 123, nitrogen raw material gas introduction pipe 113, and HCl gas introduction pipe 111 at the raw material introduction zone was observed. This quartz reactor tube 101 contaminated with deposits 9 was cleaned by vapor phase etching, likewise Example 10.

Then, a (0001) sapphire substrate (underlying substrate 10) and a pBN protection drum (protection member 117) were arranged in reaction chamber 110, likewise Example 10. An AlN crystal substance (group III nitride crystal substance 11) was grown on underlying substrate 10 for ten hours under the conditions of 1000° C. for the temperature in group III element raw material gas generation chamber 120, 700° C. for the temperature at the raw material introduction zone, 1100° C. for the temperature at the crystal growth zone in reaction chamber 110, 50.65 hPa (0.05 atm) for the AlCl$_3$ gas partial pressure, and 506.5 hPa (0.5 atm) for the NH$_3$ gas partial pressure.

The concentrations of O atoms and Si atoms in the obtained AlN crystal substance was $5.8\times10^{18}$ cm$^{-3}$ and below $1.0\times10^{17}$ cm$^{-3}$, respectively. No cracks were observed in this AlN crystal substance subsequent to peripheral grinding, surface grinding, and polishing. The interior of reaction chamber 110 subsequent to the AlN crystal growth was observed. Although deposits of approximately 0.1-0.5 mm in thickness formed of polycrystalline AlN adhered to the inner wall of quartz reactor tube 101, likewise Example 10, the thickness of the deposits adhering to the ends of group III element raw material gas introduction pipe 123 and nitrogen raw material gas introduction pipe 113 were reduced to 0.1 mm or smaller. This is probably due to the growth of polycrystalline AlN being degraded by reducing the temperature at the ends of group III element raw material gas introduction pipe 123 and nitrogen raw material gas introduction pipe 113, i.e. the region where the raw material are mixed with each other.

Example 12

A GaN crystal substance was grown using group III nitride crystal substance fabrication apparatus 100 shown in FIG. 1 according to the present invention. Crystal growth was conducted without providing a device to trap ammonium chloride (trap device 116) in fabrication apparatus 100. First, a new quartz reactor tube 101 constituting reaction chamber 110 was set in fabrication apparatus 100. In order to remove impurities such as moisture in quartz reactor tube 101, pre-baking was conducted for 50 hours at the temperature of 1050° C. in the reaction chamber while supplying a flow of $N_2$ gas in reaction chamber 110. Then, a (0001) sapphire substrate of 50.8 mm in diameter was set as underlying substrate 10 in reaction chamber 110. A GaN crystal substance (group III nitride crystal substance 11) was grown on underlying substrate 10 for 15 hours under the conditions of 1000° C. for the temperature at group III element raw material gas generation chamber 120 and the raw material introduction zone and 1100° C. for the temperature at the crystal growth zone in reaction chamber 110, and 5.065 hPa (0.005 atm) for the HCl gas partial pressure (GaCl gas partial pressure) and 303.9 hPa (0.3 atm) for the $NH_3$ gas partial pressure.

The obtained GaN crystal substance had a flat surface with polycrystalline GaN adhering to the periphery. The surface of the GaN crystal substance subjected to XRD (X-ray diffraction) was a (0001) plane. In other words, the GaN crystal substance was formed at the region growing at the C-plane (C-plane growth domain). The GaN crystal substance had the thickness of 2.6 mm, and no cracks were observed. By grinding the GaN crystal substance with a peripheral grinder, a GaN crystal disk of 50 mm in diameter was obtained. Then, the surface of the GaN crystal substance was ground and polished, and then subjected to SIMS analysis. The concentration of O atoms and Si atoms of the GaN crystal substance was below $1.0 \times 10^{17}$ $cm^{-3}$ and $6.8 \times 10^{17}$ $cm^{-3}$, respectively. The carrier concentration of the GaN crystal substance was measured using a Hall measurement apparatus. The carrier concentration was $6.6 \times 10^{17}$ $cm^{-3}$, substantially matching the Si atom concentration.

Example 13

In the case where a GaN crystal substrate is to be employed as a conductive substrate for an LED (Light Emitting Diode), LD (laser diode), and the like, at least $0.8 \times 10^{18}$ $cm^{-3}$, preferably at least $1.0 \times 10^{18}$ $cm^{-3}$, is required for the carrier concentration of the GaN crystal substrate. To this end, a GaN crystal substance was grown under conditions similar to those of Example 12 provided that, in addition to the Si atoms generated from quartz reactor tube 101, Si atoms were doped using $SiH_4$ gas at the partial pressure of $4.559 \times 10^{-3}$ Pa ($4.5 \times 10^{-8}$ atm) such that the carrier concentration of the crystal substance attains $1.0 \times 10^{18}$ $cm^{-3}$. As a result, a GaN crystal substance having the carrier concentration of $1.2 \times 10^{18}$ $cm^{-3}$, substantially as designed, could be obtained.

Example 14

By growing a GaN crystal substance for 550 hours under the crystal growing conditions of Example 13, the crystal carrier concentration became lower than $0.8 \times 10^{18}$ $cm^{-3}$, even though Si atoms are doped to the GaN crystal substance using $SiH_4$ gas with the partial pressure of $4.559 \times 10^{-3}$ Pa ($4.5 \times 10^{-8}$ atm). Supply of $SiH_4$ gas was ceased, and a GaN crystal substance was grown under conditions similar to those of Example 12. The obtained crystal substance was ground by a cylindrical grinder to obtain a GaN crystal disk of 48 mm in diameter. After grinding and polishing the surface of the GaN crystal disk at both sides, no cracks were observed using a microscope. The concentration of Si atoms in the GaN crystal substance was as low as $1.3 \times 10^{17}$ $cm^{-3}$ by SIMS analysis. Here, a GaN crystal substance was grown under conditions similar to those of Example 12, provided that Si was doped by the $SiH_4$ gas partial pressure of $1.013 \times 10^{-2}$ Pa ($1.0 \times 10^{-7}$ atm) such that the crystal carrier concentration attains $1.0 \times 10^{-18}$ $cm^{-3}$. As a result, a GaN crystal substance having a carrier concentration of $1.2 \times 10^{18}$ $cm^{-3}$, substantially as designed, could be obtained.

Example 15

By growing a GaN crystal substance further for 550 hours under the crystal growing conditions of Example 14, the crystal carrier concentration became lower than $0.8 \times 10^{18}$ $cm^{-3}$ even though Si atoms are doped into the GaN crystal substance using the $SiH_4$ gas with the partial pressure of $1.013 \times 10^{-2}$ Pa ($1.0 \times 10^{-7}$ atm). Therefore, supply of $SiH_4$ gas was ceased to grow a GaN crystal substance under conditions similar to those of Example 12. Likewise Example 14, the obtained crystal substance was subjected to cylindrical grinding, had both sides ground and polished, and then subjected to SIMS analysis. The Si atom concentration of the GaN crystal substance became as low as $0.9 \times 10^{17}$ $cm^{-3}$. Here, a GaN crystal substance was grown under the conditions similar to those of Example 12, provided that Si atoms were doped with the partial pressure of the $SiH_4$ gas at $1.216 \times 10^{-3}$ Pa ($1.2 \times 10^{-8}$ atm) such that the crystal carrier concentration attains the level of $1.0 \times 10^{18}$ $cm^{-3}$. As a result, a GaN crystal substance having the carrier concentration of $1.2 \times 10^{18}$ $cm^{-3}$, substantially as designed, could be obtained.

From Examples 13-15, it is identified that the concentration of the doping gas must be modified in accordance with the duration of using quartz reactor tube 101 when Si atoms are to be doped into the GaN crystal substance. Examples 13-15 were based on the usage of $SiH_4$ gas as the doping gas. Since the change in the Si concentration in the crystal substance in association with the usage duration of the quartz reactor tube is caused by the change in the amount of the Si type gas generated from quartz reaction tube 101 instead of the amount of doping gas, the same result can be obtained even if $SiH_2Cl_2$ gas, $SiCl_4$ gas, or the like is employed as the doping gas.

With regards to controlling the concentration of O atoms in the facet growth domain of the GaN crystal substances in Examples 1-9, it was confirmed that the concentration of O atoms becomes lower in proportion to the duration of using quartz reactor tube 101 when growth of a GaN crystal substance is continued under the crystal growing conditions such as of Example 9. It was also confirmed that the concentration of O atoms can be increased by raising the temperature at the raw material introduction zone, as shown in Examples 4-6. Further, it was confirmed that the moisture ($H_2O$ gas) or $O_2$ gas can be used as dopant gas.

Although Examples 1-15 are based on the case where a sapphire substrate is employed as the underlying substrate, it was confirmed that the same effect can be obtained by using a (111) GaAs substrate (GaAs substrate with (111) plane as the crystal growing plane), a (0001) SiC substrate (SiC substrate with (0001) plane as the crystal growth plane), an LiAlGaO substrate, or a GaN substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a group III nitride crystal substance, comprising the step of cleaning an interior of a reaction chamber by introducing HCl gas into said reaction chamber, and the step of vapor deposition of a group III nitride crystal substance in said cleaned reaction chamber, wherein said reaction chamber is formed by a reactor tube containing oxygen atoms and silicon atoms, in said step of vapor deposition of a group III nitride crystal substance, at least ammonia as and hydrogen gas are brought into contact with said reactor tube to generate moisture and Si type gas such that said oxygen atoms in said moisture and said silicon atoms in said Si type gas enter said group III nitride crystal substance.

2. The fabrication method of a group III nitride crystal substance according to claim 1, wherein said group III nitride crystal substance includes one of a GaN crystal substance and an AlN crystal substance.

3. The fabrication method of a group III nitride crystal substance according to claim 1, wherein said group III nitride crystal substance is a GaN crystal substance, and includes a facet growth domain and a C-plane growth domain, and a concentration of said silicon atoms at said facet growth domain is lower than $1.0 \times 10^{17}$ cm$^{-3}$, and a concentration of said oxygen atoms at said C-plane growth domain is lower than $1.0 \times 10^{17}$ cm$^{-3}$.

4. The fabrication method of a group III nitride crystal substance according to claim 1, wherein said group III nitride crystal substance is a GaN crystal substance, and is formed at a C-plane growth domain, and said silicon atoms enter said C-plane growth domain.

5. The fabrication method of a group III nitride crystal substance according to claim 4, wherein a carrier concentration of said group III nitride crystal substance is set to at least $0.8 \times 10^{18}$ cm$^{-3}$ using doping gas of silicon atoms, in addition to said Si type gas.

6. The fabrication method of a group III nitride crystal substance according to claim 5, wherein employing any of SiH$_4$ gas, SiH$_2$Cl$_2$ gas and SiCl$_4$ gas as said doping gas.

* * * * *